United States Patent
Zhang et al.

(10) Patent No.: US 12,250,828 B2
(45) Date of Patent: *Mar. 11, 2025

(54) SEMICONDUCTOR STRUCTURE AND FABRICATION METHOD THEREOF

(71) Applicant: HeFeChip Corporation Limited, Sai Ying Pun (HK)

(72) Inventors: John H Zhang, Altamont, NY (US); Brian Li Ji, Mount Kisco, NY (US); Yanzun Li, Lagrangeville, NY (US); Devendra K Sadana, Pleasantville, NY (US)

(73) Assignee: HEFECHIP CORPORATION LIMITED, Sai Ying Pun (HK)

( * ) Notice: Subject to any disclaimer, the term of this patent is extended or adjusted under 35 U.S.C. 154(b) by 420 days.

This patent is subject to a terminal disclaimer.

(21) Appl. No.: 17/683,382

(22) Filed: Mar. 1, 2022

(65) Prior Publication Data
US 2023/0284458 A1  Sep. 7, 2023

(51) Int. Cl.
*H10B 61/00* (2023.01)
*H01L 49/02* (2006.01)
(Continued)

(52) U.S. Cl.
CPC .......... *H10B 61/22* (2023.02); *H01L 28/75* (2013.01); *H01L 28/92* (2013.01); *H10N 50/10* (2023.02);
(Continued)

(58) Field of Classification Search
CPC .... H10B 61/22; H10B 12/00; H10B 12/0385; H10B 12/37; H10B 12/50; H01L 28/75;
(Continued)

(56) References Cited

U.S. PATENT DOCUMENTS 7,276,751 B2   10/2007  Ho
9,659,939 B1*   5/2017  Cao ................ H10B 12/37
(Continued)

FOREIGN PATENT DOCUMENTS

JP   2005251818 A  *  9/2005

OTHER PUBLICATIONS

Abe, Novel Hybrid DRAM/MRAM Design for Reducing Power of High Performance Mobile CPU, 2012.

*Primary Examiner* — Shaun M Campbell
*Assistant Examiner* — Teresa M. Arroyo
(74) *Attorney, Agent, or Firm* — Muncy, Geissler, Olds & Lowe, P.C.

(57) ABSTRACT

A semiconductor structure includes a substrate having a doped silicon substrate, a buried oxide layer, and a silicon device layer. A capacitor having an inner electrode and a node dielectric layer is formed in the substrate. The inner electrode and the node dielectric layer extend into the doped silicon substrate. A select transistor is disposed in the silicon device layer. An embedded contact is disposed atop the capacitor to electrically couple a doped region of the select transistor with the inner electrode. A first dielectric layer is disposed around the select transistor. A second dielectric layer is deposited on the first dielectric layer. A contact plug is formed in the second dielectric layer and the first dielectric layer and is in direct contact with the embedded contact. A memory stack with a MTJ element is disposed on the contact plug.

16 Claims, 16 Drawing Sheets

(51) Int. Cl.
  *H10B 12/00* (2023.01)
  *H10N 50/01* (2023.01)
  *H10N 50/10* (2023.01)
  *H10N 50/80* (2023.01)
  *H10N 50/85* (2023.01)
(52) U.S. Cl.
  CPC ............. *H10N 50/80* (2023.02); *H10N 50/85* (2023.02); *H10B 12/00* (2023.02); *H10N 50/01* (2023.02)
(58) Field of Classification Search
  CPC ......... H01L 28/92; H01L 28/90; H10N 50/10; H10N 50/80; H10N 50/85; H10N 50/01
  See application file for complete search history.

(56) References Cited

U.S. PATENT DOCUMENTS

| | | | |
|---|---|---|---|
| 11,049,862 B2* | 6/2021 | Zhang | H10B 12/0385 |
| 2003/0025140 A1* | 2/2003 | Kusters | H10B 12/373 |
| | | | 257/E27.093 |
| 2007/0057302 A1* | 3/2007 | Ho | H01L 28/91 |
| | | | 438/386 |
| 2009/0174015 A1* | 7/2009 | Gu | H10N 50/10 |
| | | | 257/E29.323 |
| 2010/0301480 A1* | 12/2010 | Choi | H10N 70/828 |
| | | | 257/773 |
| 2016/0300612 A1* | 10/2016 | Manipatruni | G11C 11/1675 |
| 2020/0020696 A1* | 1/2020 | Lin | H10N 70/8265 |
| 2021/0375915 A1* | 12/2021 | Zhang | H10B 41/40 |
| 2023/0067715 A1* | 3/2023 | Yuh | H01L 21/76898 |

* cited by examiner

SEMICONDUCTOR STRUCTURE AND FABRICATION METHOD THEREOF

BACKGROUND OF THE INVENTION

1. Field of the Invention

The present disclosure relates generally to the field of semiconductor technology. More particularly, the present disclosure relates to a semiconductor memory structure and a method for fabricating the same.

2. Description of the Prior Art

Magnetoresistive random access memory (MRAM), based on the integration of silicon CMOS with magnetic tunnel junction (MTJ) technology, is a major emerging technology that is highly competitive with existing semiconductor memories such as SRAM, DRAM, Flash, etc.

A MRAM device is generally comprised of an array of parallel first conductive lines such as word lines on a horizontal plane, an array of parallel second conductive lines such as bit lines on a second horizontal plane spaced above and formed in a direction perpendicular to the first conductive lines, and a MTJ element interposed between a first conductive line and a second conductive line at each crossover location. Typically, access transistors may be disposed below the array of first conductive lines to select certain MRAM cells within the MRAM array for read or write operations.

As known in the art, DRAM/MRAM cell-level hybrid structured memory (D-MRAM) with three-transistor, one-MTJ (3T-1MTJ) configuration has been developed to enable effective power reduction for high performance mobile SoCs without area overhead.

With advanced perpendicular magnetic tunnel junctions (pMTJ) that decrease the write energy and latency, D-MRAM is capable of power reduction by replacing the traditional SRAM caches. However, the leakage power improvement the above-described 3T-1MTJ D-MRAM device is limited due to low storage capacitance, which leads to low retention time.

SUMMARY OF THE INVENTION

It is one object to provide an improved D-MRAM device with 3T-1MTJ configuration in order to solve the above-described prior art shortcomings or problems.

According to one aspect of the present disclosure, a semiconductor structure includes a substrate having a doped silicon substrate, a buried oxide layer on the doped silicon substrate, and a silicon device layer on the buried oxide layer. A capacitor having an inner electrode and a node dielectric layer is formed in a trench of the substrate. The inner electrode and the node dielectric layer penetrate through the buried oxide layer and extend into the doped silicon substrate. A select transistor is disposed in the silicon device layer and in proximity to the capacitor, wherein the silicon device layer forms a silicon fin. An embedded contact is disposed atop the capacitor to electrically couple a doped region of the select transistor with the inner electrode of the capacitor. A first dielectric layer is disposed around the select transistor. A second dielectric layer is deposited on the first dielectric layer and covers the select transistor. A contact plug penetrates through the second dielectric layer and the first dielectric layer. The contact plug is in direct contact with the embedded contact. A memory stack is electrically connected to the contact plug. The memory stack comprises a magnetic tunnel junction (MTJ) element.

According to some embodiments, the node dielectric layer lines a sidewall of the trench.

According to some embodiments, the inner electrode is surrounded by the node dielectric layer.

According to some embodiments, the inner electrode comprises a doped polysilicon layer and a TiN layer between the node dielectric layer and the doped polysilicon layer.

According to some embodiments, the doped polysilicon layer has a top surface that is higher than an upper surface of the doped silicon substrate.

According to some embodiments, the embedded contact is buried in the silicon device layer and the buried oxide layer.

According to some embodiments, the embedded contact comprises a fin-shaped contact portion sandwiched by a fork-shaped lower portion of the contact plug.

According to some embodiments, a metal gate is disposed on the silicon fin.

According to some embodiments, the embedded contact comprises a metallic layer wrapped around by a silicide layer, and wherein a portion of the silicide layer is interposed between the metallic layer and the inner electrode.

According to some embodiments, the silicide layer is interposed between the silicon fin and the fin-shaped contact portion.

According to some embodiments, the metallic layer comprises W, Ti, TiN, Ta, TaN, Cu, Au, Ni, or any combinations thereof.

According to some embodiments, the silicide layer comprises tungsten silicide, cobalt silicide, nickel silicide, or titanium silicide.

According to some embodiments, the contact plug is a tungsten contact plug.

According to some embodiments, the capacitor comprises a step structure around the upper portion of the trench.

According to some embodiments, the node dielectric layer and the inner electrode constitute the step structure.

According to some embodiments, the memory stack is formed in a circuit layer, wherein the memory stack is electrically connected to the contact plug through the circuit layer.

According to some embodiments, the memory stack is disposed on the contact plug.

According to some embodiments, the MTJ element comprises a reference layer, a tunnel barrier layer on the reference layer, and a free layer on the tunnel barrier layer.

According to some embodiments, the reference layer comprises a magnetic material comprising Co and Fe.

According to some embodiments, the reference layer comprises a magnetic superlattice structure comprising repeated alternating layers of two or more materials, including $(Co/Pt)_n$, $(Co/Pd)_n$, $(Co/Ni)_n$, $(CoFe/Pt)_n$, $(Co/Pt(Pd))_n$, or any combination thereof.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
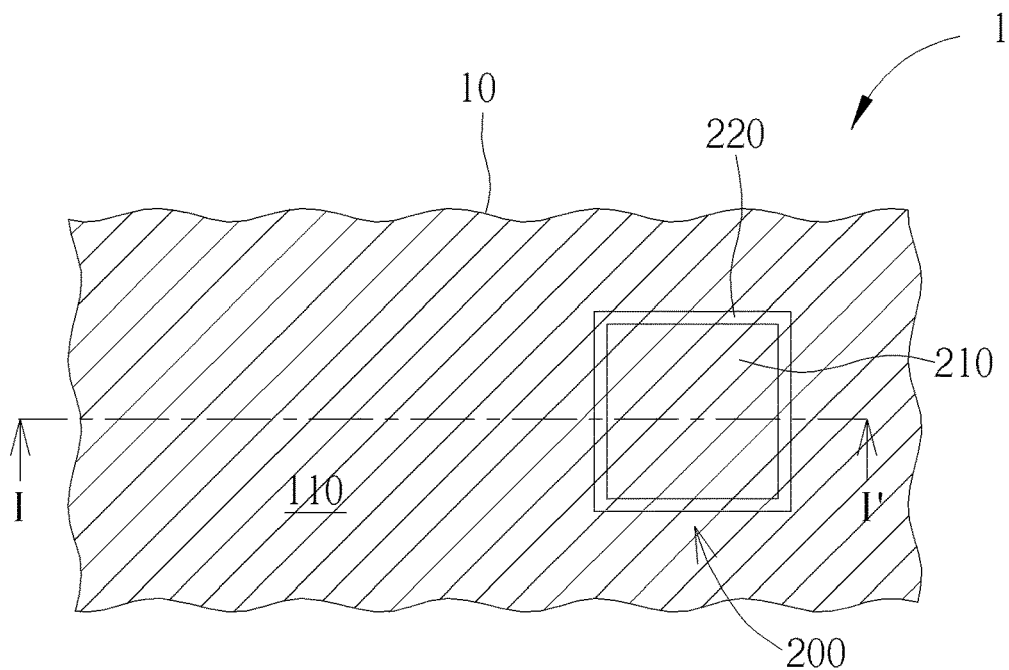
FIG. 1 is a top view of a substrate in which a capacitor and a metal contact are formed according to an embodiment of the invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A magnetic tunnel junction (MTJ) element may be based on a tunneling magneto-resistance (TMR) effect wherein a stack of layers has a configuration in which two ferromagnetic layers are separated by a thin non-magnetic dielectric layer. If the non-magnetic dielectric layer is thin enough (typically a few nanometers), electrons can tunnel from one ferromagnet into the other. In a MRAM device, the MTJ element is typically formed between a bottom electrode and a top electrode. For example, a MTJ stack of layers that is subsequently patterned to form a MTJ element may be formed by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction.

The present disclosure pertains to an improved semiconductor structure that is particularly suited for D-MRAM devices with 3T-1MTJ scheme. By incorporating a capacitor, the storage capacitance and data retention time of the D-MRAM devices can be significantly increased. Since the capacitor can provide greater capacitance, the retention time of the D-MRAM devices is significantly increased. The proposed semiconductor structure is able to dramatically reduce the frequency of data refreshing and thus the leakage power of the D-MRAM devices.

Figure 1A:
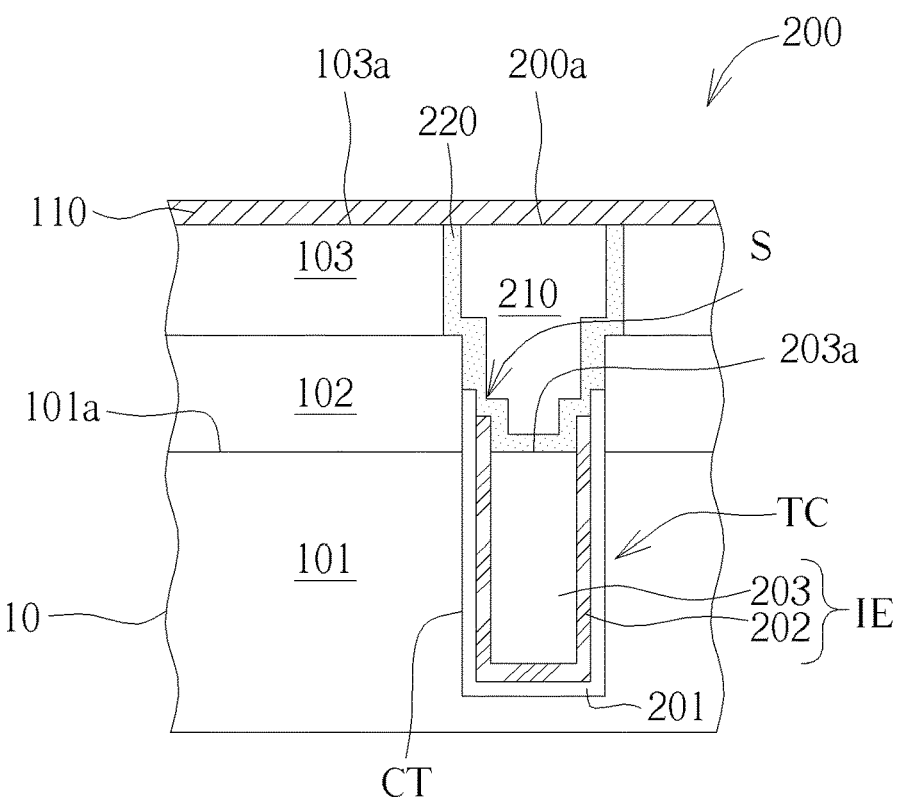
FIG. 1A is a cross-sectional views taken along line I-I' in FIG. 1.

FIG. 1 is a top view of a substrate in which a capacitor and a metal contact are formed according to an embodiment of the invention. FIG. 1A is a cross-sectional view taken along line I-I' in FIG. 1. As shown in FIG. 1 and FIG. 1A, the substrate 10 may be a silicon-on-insulator (SOI) substrate comprising a doped silicon substrate 101, a buried oxide layer 102, and a silicon device layer 103.

According to one embodiment, for example, the SOI structure may be a SIMOX wafer or a bonded wafer, which are both commercially available.

According to one embodiment, for example, the doped silicon substrate 101 may be an N-type heavily doped silicon substrate, and the silicon device layer 103 may be a P-type silicon layer. According to one embodiment, for example, the silicon device layer 103 may have a thickness of about 50-500 nm, the buried oxide layer 102 may have a thickness of about 100-500 nm, and the doped silicon substrate 101 may be 50-500 micrometers, but not limited thereto.

According to one embodiment, a hard mask layer 110 may be deposited on a top surface 10a of the silicon device layer 103. For example, the hard mask layer 110 may comprise silicon nitride and may be deposited by chemical vapor deposition (CVD) methods known in the art.

A capacitor TC is formed in the substrate 10. The capacitor TC may penetrate through the buried oxide layer 102 and may extend to a predetermined depth (e.g., several micrometers) into the doped silicon substrate 101. The capacitor TC comprises a trench CT and a node dielectric layer 201 such as $HfSiO_x$. The node dielectric layer 201 conformally lines the sidewall of the trench CT. The node dielectric layer 201 may extend up to the sidewall of the buried oxide layer 102. The sidewall of the buried oxide layer 102 may be partially covered by the node dielectric layer 201.

According to one embodiment, the capacitor TC further comprises an inner capacitor electrode IE that is surrounded by the node dielectric layer 201. The node dielectric layer 201 electrically isolate the inner capacitor electrode IE from the doped silicon substrate 101 that acts as the other capacitor electrode or outer electrode of the capacitor TC. According to one embodiment, the inner capacitor electrode IE may comprise a barrier layer 202 and a doped polysilicon layer 203 surrounded by the barrier layer 202. The barrier layer 202 is located between the node dielectric layer 201 and the doped polysilicon layer 203. The barrier layer 202 may comprise titanium nitride (TiN), tantalum nitride (TaN), or other metals with low ohmic contact resistance.

According to one embodiment, the top surface 203a of the doped polysilicon layer 203 may be higher than the upper surface 101a of the doped silicon substrate 101. In some embodiments, the top surface 203a of the doped polysilicon layer 203 may be higher than the upper surface of the barrier layer 202. According to one embodiment, the barrier layer 202 may protrude from the top surface 203a of the doped polysilicon layer 203. The upper end of the node dielectric layer 201, the upper end of the barrier layer 202, and the top surface 203a of the doped polysilicon layer 203 may constitute a step structure S around the upper portion of the trench CT.

According to one embodiment, an embedded contact 200 is provided on top of the inner capacitor electrode IE. The embedded contact 200 is buried in the silicon device layer 101 and the buried oxide layer 102. According to one embodiment, the embedded contact 200 may comprise a metallic layer 210 such as tungsten (W) wrapped around by a silicide layer 220 such as tungsten silicide ($WSi_x$). A portion of the silicide layer 220 is interposed between the metallic layer 210 and the inner capacitor electrode IE. According to one embodiment, the embedded contact 200 has a top surface 200a that is coplanar with a top surface 103a of the silicon device layer 103. According to one embodiment, the embedded contact 200 is covered by the hard mask layer 110.

According to one embodiment, for example, the metallic layer 210 further comprises Ti, TiN, Ta, TaN, Cu, Au, Ni, or any combinations thereof. According to one embodiment, for example, the silicide layer 220 further comprises cobalt silicide ($CoSi_x$), nickel silicide ($NiSi_x$), or titanium silicide ($TiSi_x$), but not limited thereto.

According to one embodiment, for example, to form the silicide layer 220, a thin metal layer (not shown) such as W, Co, Ni, or Ti is deposited on the substrate 10. The thin metal layer conformally covers the interior surface of the trench CT including a surface of the capacitor TC. The thin metal layer is in direct contact with an exposed sidewall of the silicon device layer 103, a polysilicon spacer deposited on a sidewall of the buried oxide layer 102, and the doped polysilicon layer 203. Subsequently, a thermal or anneal process such as a rapid thermal annealing (RTA) is performed such that the thin metal layer reacts with the exposed sidewall of the silicon device layer 103, the polysilicon spacer, and the doped polysilicon layer 203, thereby forming the silicide layer 220. The unreacted metal layer may be removed using methods known in the art.

Figure 2:
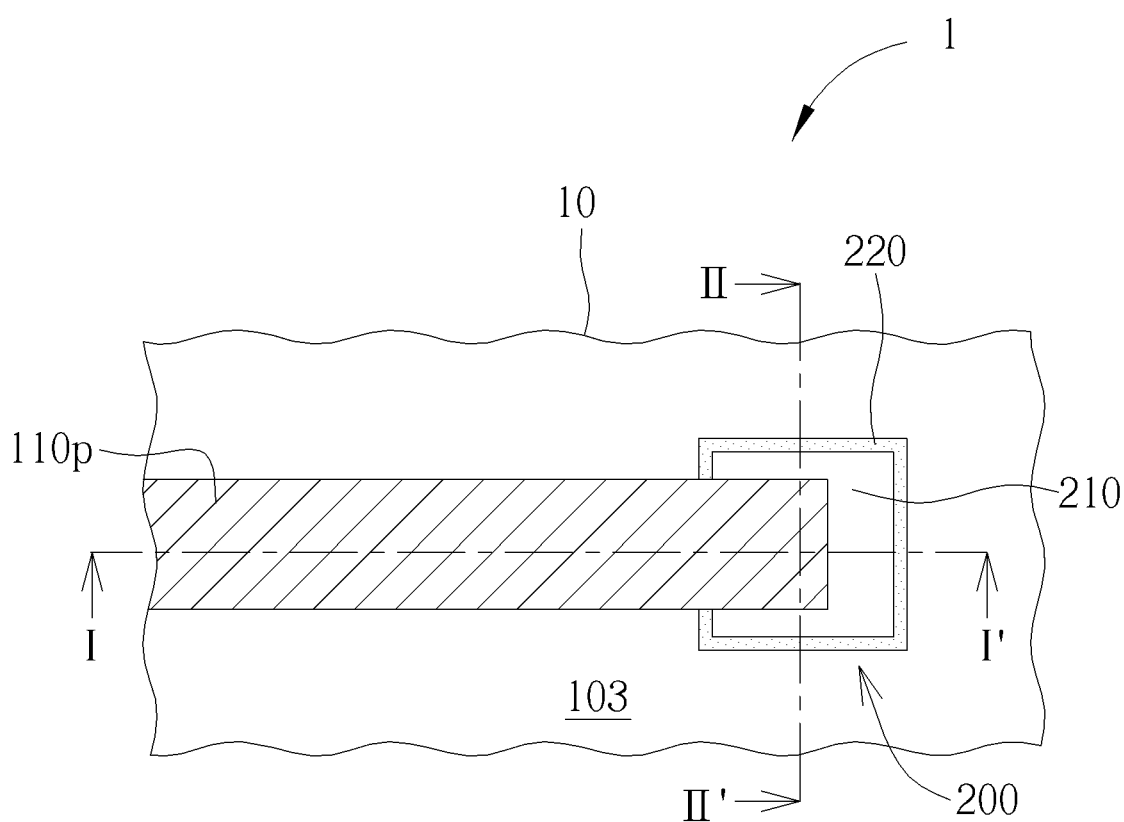
FIG. 2 is a top view of a substrate in which a capacitor and a metal contact are formed according to an embodiment of the invention, which shows the patterned hard mask layer.
Figure 2A:
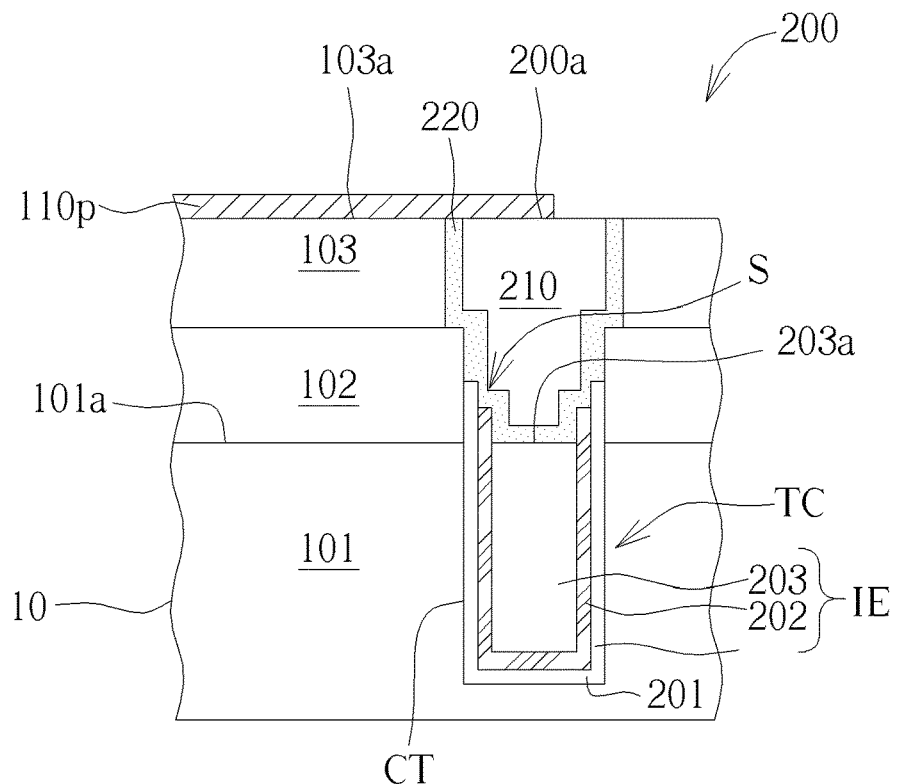
FIG. 2A and FIG. 2B are cross-sectional views taken along line I-I' and II-II' in FIG. 2, respectively.
Figure 2B:
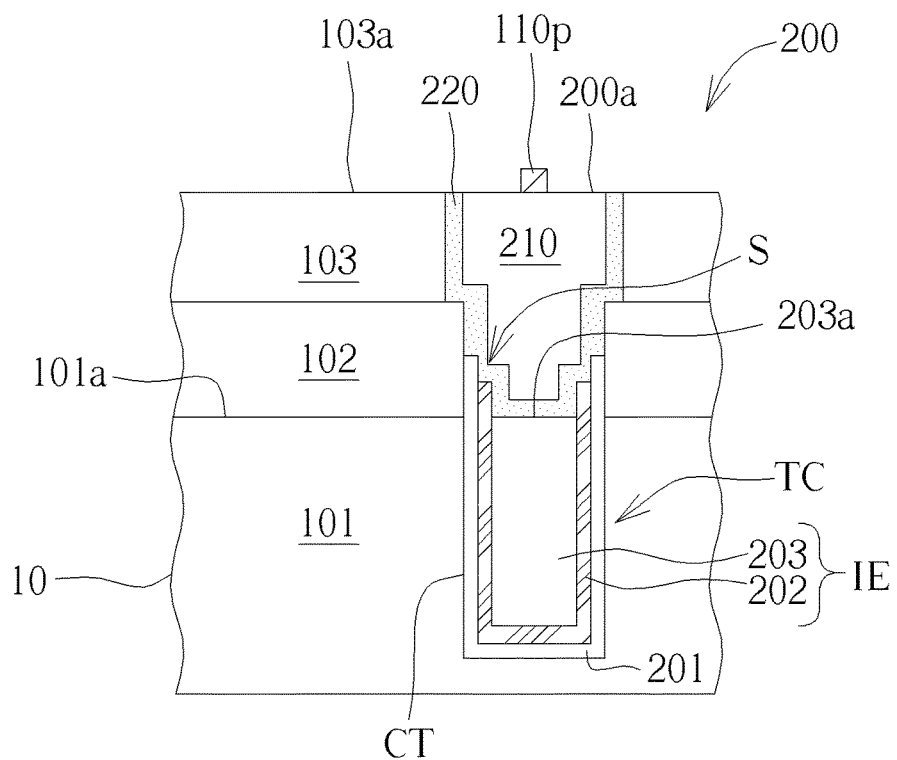

Please refer to FIG. 2, FIG. 2A and FIG. 2B. FIG. 2 is a top view of a substrate in which a capacitor and a metal contact are formed according to an embodiment of the invention, which shows the patterned hard mask layer. FIG. 2A and FIG. 2B are cross-sectional views taken along line I-I' and II-II' in FIG. 2, respectively. As shown in FIG. 2, FIG. 2A and FIG. 2B, the hard mask layer 110 is subjected to a lithographic process and an etching process and a patterned hard mask layer 110p is formed on the silicon device layer 103. According to one embodiment, the patterned hard mask layer 110p may have a strip shaped pattern (see FIG. 2) and may partially overlap with the embedded contact 200.

Figure 3:
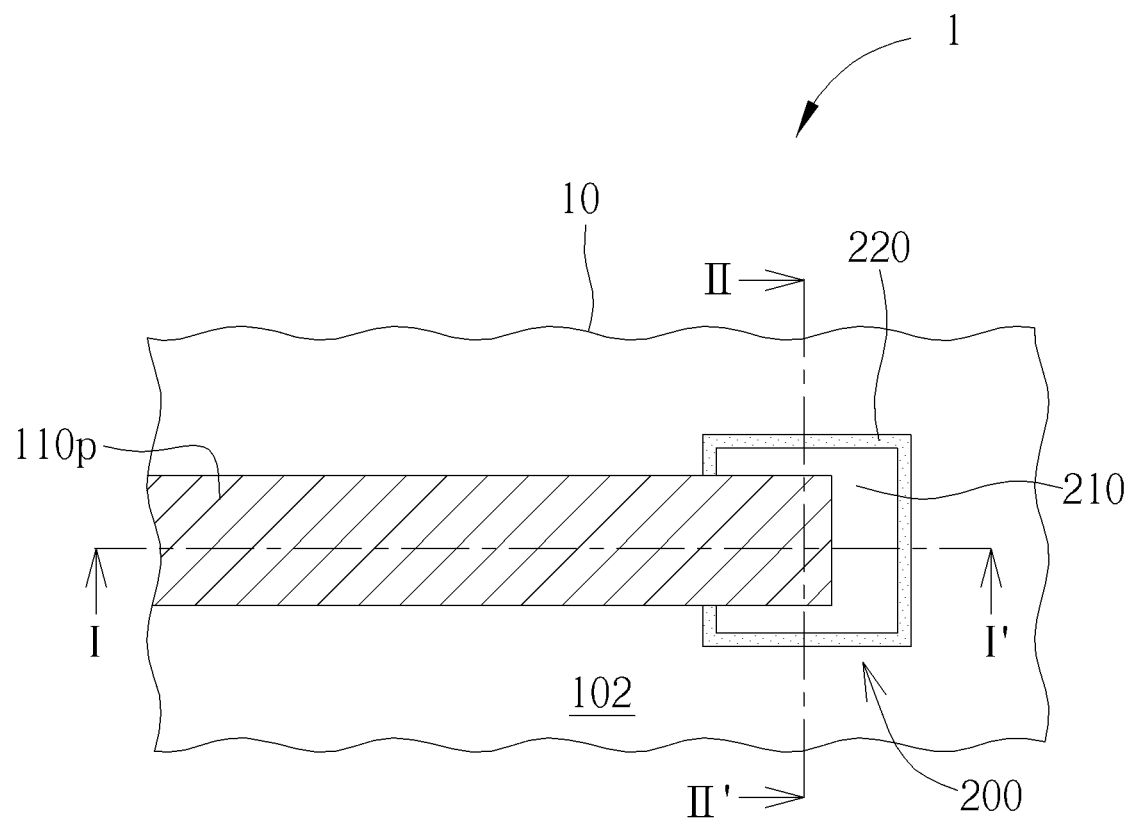
FIG. 3 is a top view of a substrate in which a capacitor and a metal contact are formed according to an embodiment of the invention, which shows the silicon fin and the fin-shaped contact portion.
Figure 3A:
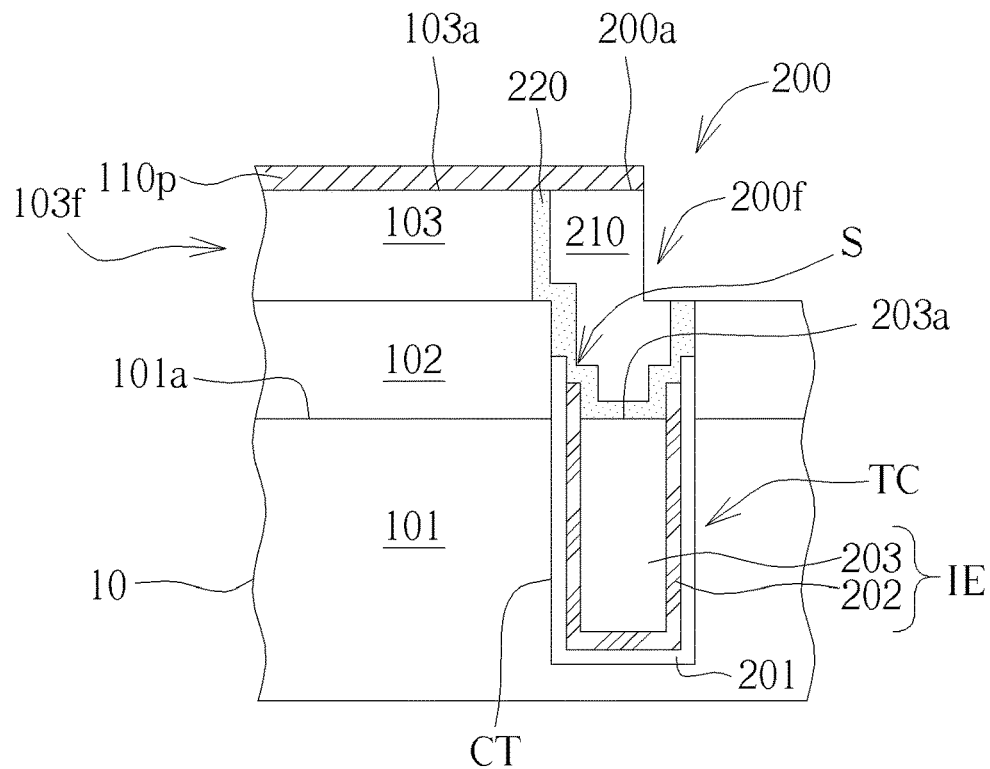
FIG. 3A and FIG. 3B are cross-sectional views taken along line I-I' and II-II' in FIG. 3, respectively.
Figure 3B:
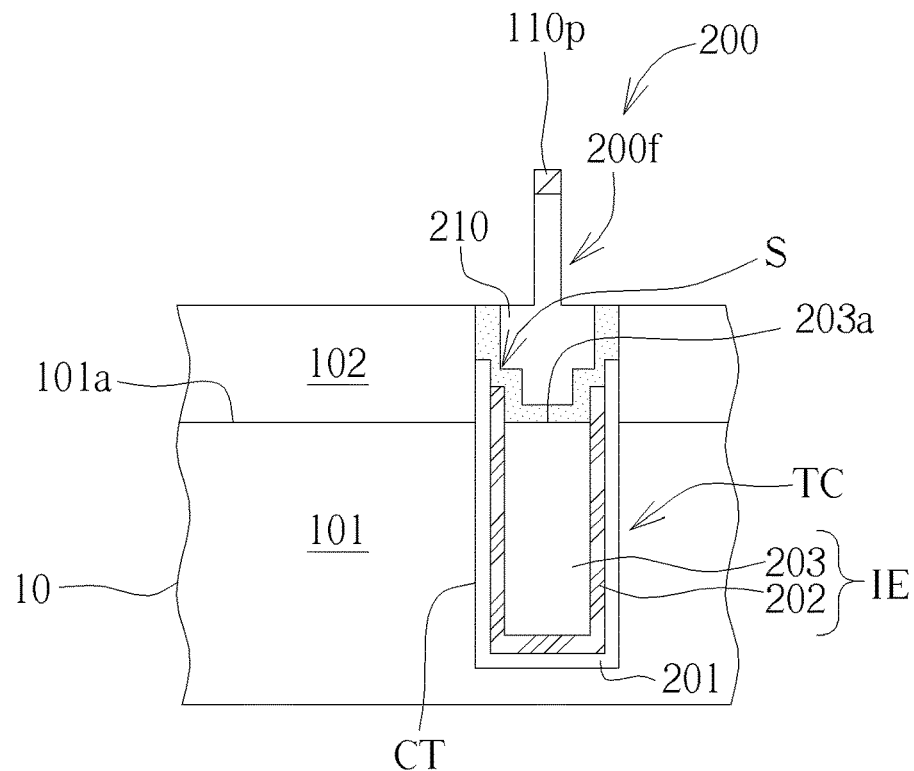

Please refer to FIG. 3, FIG. 3A and FIG. 3B. FIG. 3 is a top view of a substrate in which a capacitor and a metal contact are formed according to an embodiment of the invention, which shows the silicon fin and the fin-shaped contact portion. FIG. 3A and FIG. 3B are cross-sectional views taken along line I-I' and II-II' in FIG. 3, respectively. As shown in FIG. 3, FIG. 3A and FIG. 3B, using the patterned hard mask layer 110p as an etching hard mask, an anisotropic dry etching process is performed to etch the silicon device layer 103 and an upper portion of the embedded contact 200 not covered by the patterned hard mask layer 110p, thereby forming a silicon fin 103f and a fin-shaped contact portion 200f connected to the silicon fin 103f.

Figure 4A:
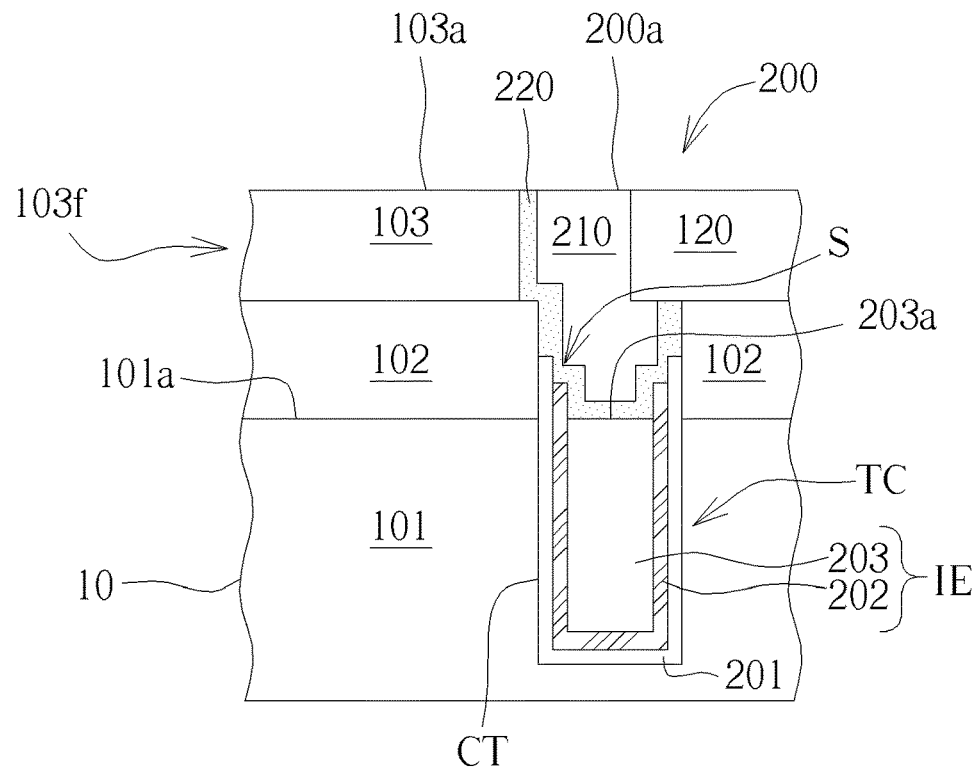
FIG. 4A and FIG. 4B are cross-sectional view taken along line I-I' and II-II' in FIG. 3, respectively, which represents the semiconductor structure after the patterned hard mask layer is removed and the FCVD process is performed.
Figure 4B:
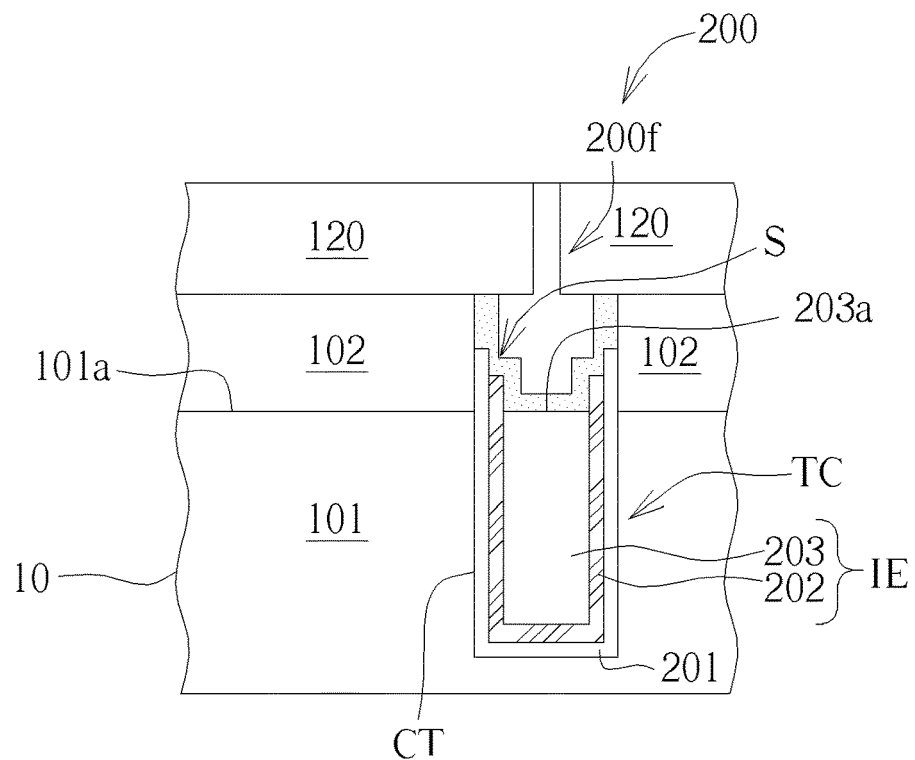

Please refer to FIG. 4A and FIG. 4B. FIG. 4A and FIG. 4B are cross-sectional views taken along line I-I' and II-II' in FIG. 3, respectively. As shown in FIG. 4A and FIG. 4B, after the formation of the silicon fin 103f and the fin-shaped contact portion 200f, the patterned hard mask layer 110p is removed. After the removal of the patterned hard mask layer 110p, a chemical vapor deposition (CVD) process such as a flowable CVD (FCVD) process may be performed to deposit a silicon oxide film 120 on the substrate 10. The silicon oxide film 120 is then subjected to a chemical mechanical polishing (CMP) process, thereby forming a planarized top surface of the silicon oxide film 120. At this point, the silicon fin 103f and the fin-shaped contact portion 200f are surrounded by the planarized silicon oxide film 120, wherein a flush surface is formed by the silicon fin 103f, the fin-shaped contact portion 200f, and the silicon oxide film 120.

Figure 5A:
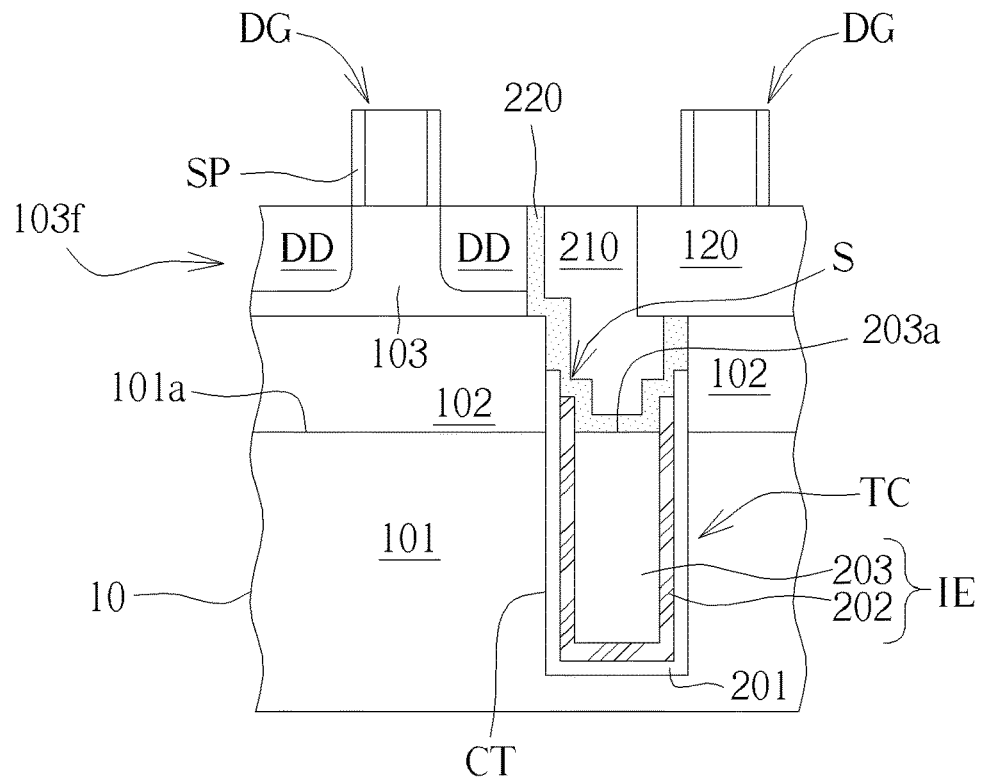
FIG. 5A and FIG. 5B are cross-sectional views taken along line I-I' and II-II' in FIG. 3, respectively, which represent the semiconductor structure after the dummy gates are formed.
Figure 5B:
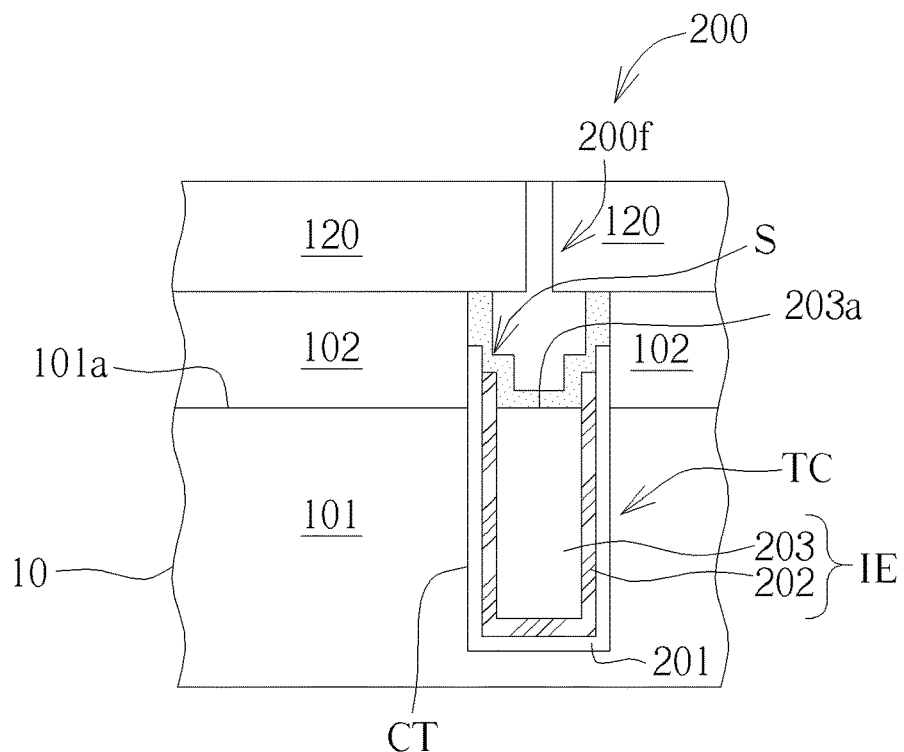

Please refer to FIG. 5A and FIG. 5B. FIG. 5A and FIG. 5B are cross-sectional views taken along line I-I' and II-II' in FIG. 3, respectively. As shown in FIG. 5A and FIG. 5B, subsequently, dummy gates DG are formed on the substrate 10. According to one embodiment, for example, the dummy gates DG may be polysilicon gates. After forming the spacers SP on the sidewalls of the dummy gates DG, an ion implantation process may be performed to form doped regions DD such as $N^+$ doped regions in the silicon fin 103f on both sides of the dummy gate DG. One of the doped regions DD is electrically connected to the fin-shaped contact portion 200f.

Figure 6A:
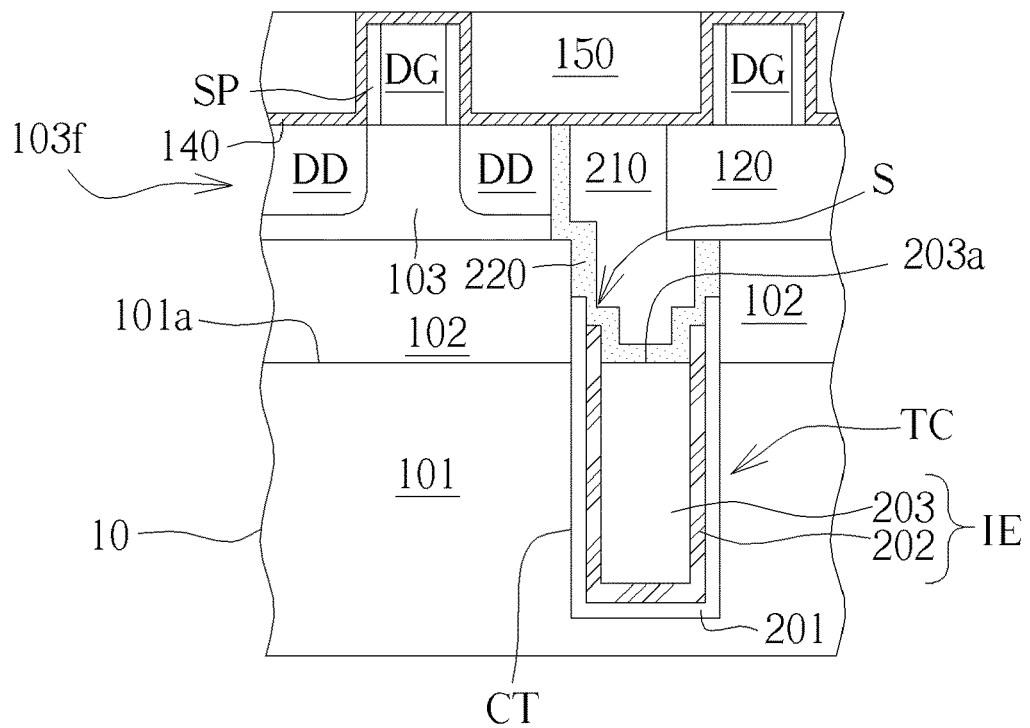
FIG. 6A and FIG. 6B are cross-sectional views taken along line I-I' and II-II' in FIG. 3, respectively, which represent the semiconductor structure after the POC layer and the FCVD oxide layer are deposited.
Figure 6B:
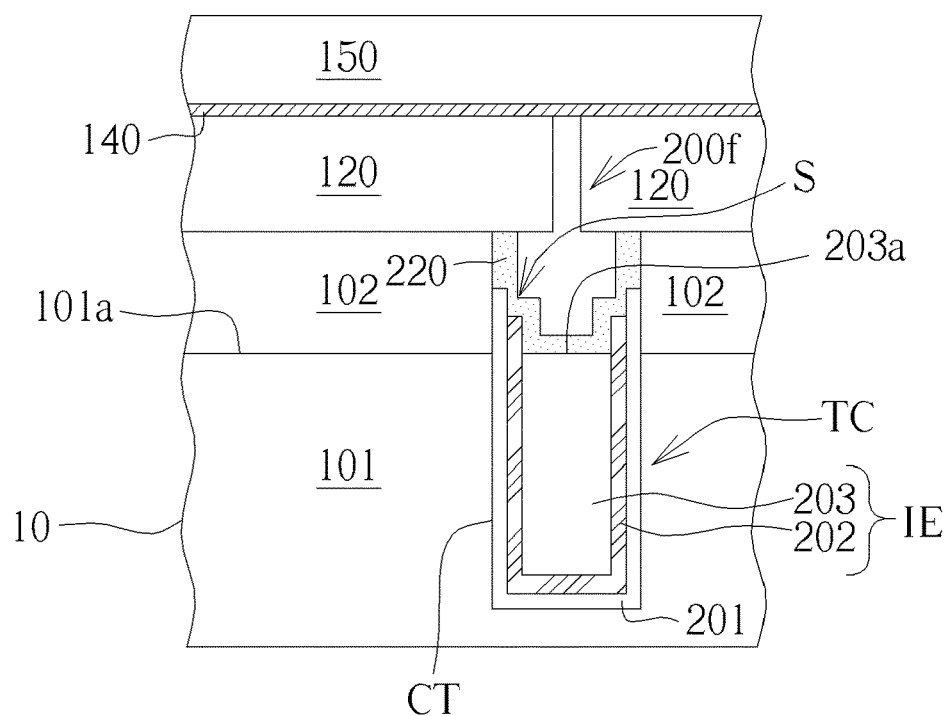

Please refer to FIG. 6A and FIG. 6B. FIG. 6A and FIG. 6B are cross-sectional views taken along line I-I' and II-II' in FIG. 3, respectively. As shown in FIG. 6A and FIG. 6B, after the formation of the dummy gates DG and the doped regions DD, a poly open CMP (POC) layer 140 and a FCVD oxide layer 150 are deposited on the substrate 10. The FCVD oxide layer 150 is then subjected to a CMP process to form a planarized top surface. At this point, the dummy gates DG are surrounded by the planarized FCVD oxide layer 150.

Figure 7A:
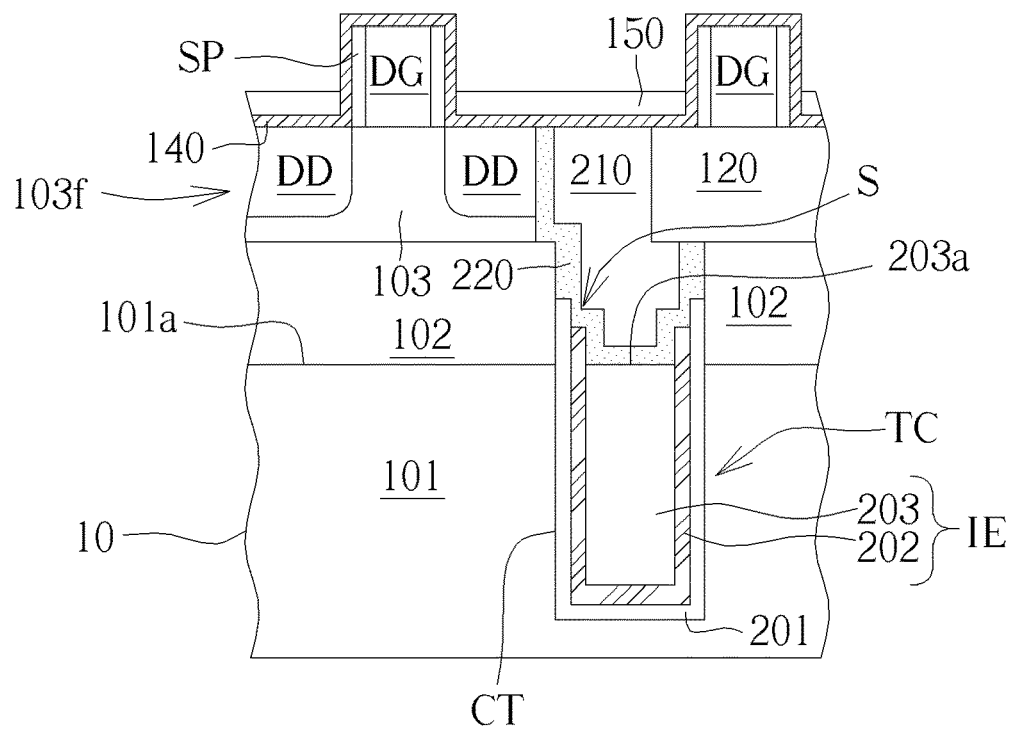
FIG. 7A and FIG. 7B are cross-sectional views taken along line I-I' and II-II' in FIG. 3, respectively, which represent the semiconductor structure after the Siconi™ etch process is performed.
Figure 7B:
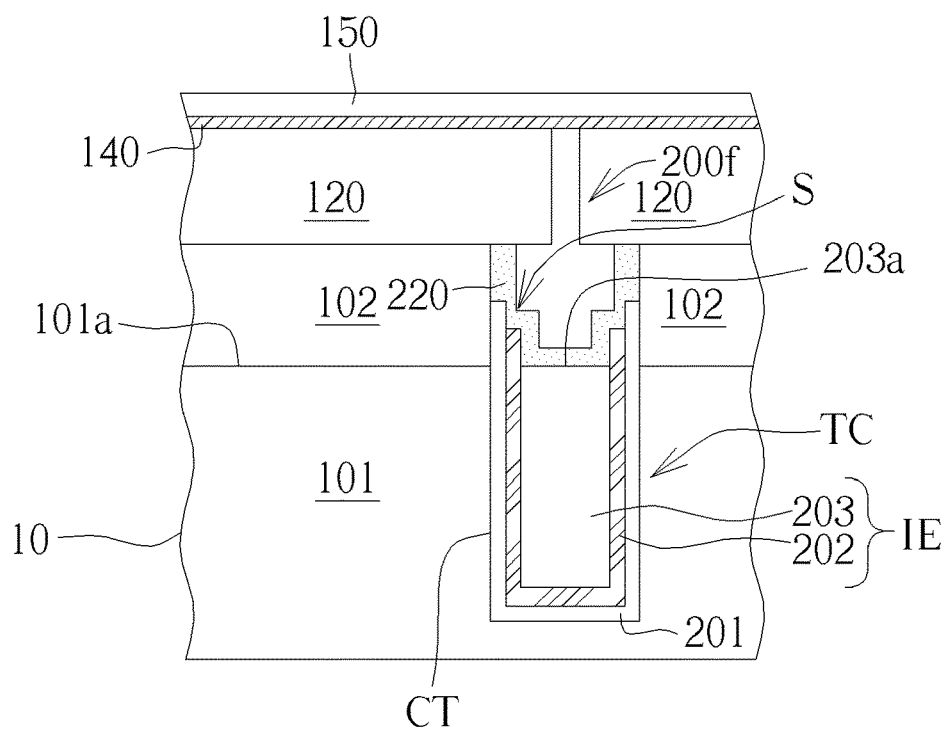

Please refer to FIG. 7A and FIG. 7B. FIG. 7A and FIG. 7B are cross-sectional views taken along line I-I' and II-II' in FIG. 3, respectively. As shown in FIG. 7A and FIG. 7B, a selective dry etch process such as a Siconi™ etch process is carried out to remove an upper portion of the FCVD oxide layer 150. According to one embodiment, the Siconi™ etch process may involve the use of hydrogen source such as ammonia ($NH_3$) in combination with fluorine source such as nitrogen trifluoride ($NF_3$).

Figure 8A:
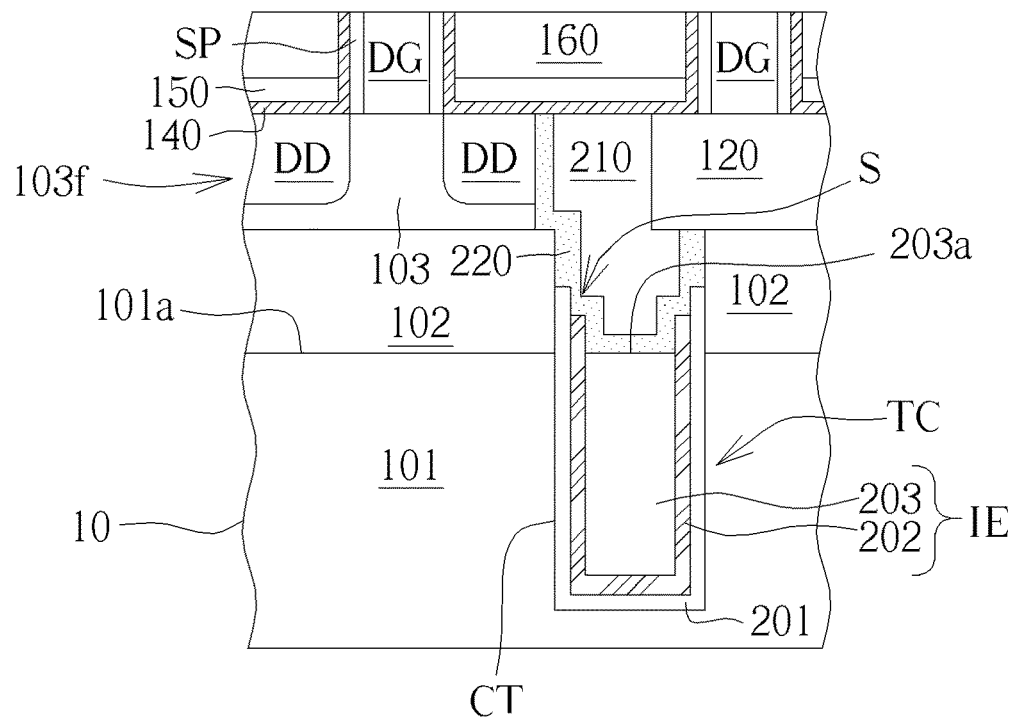
FIG. 8A and FIG. 8B are cross-sectional views taken along line I-I' and II-II' in FIG. 3, respectively, which represent the semiconductor structure after the HDPCVD process is performed.
Figure 8B:
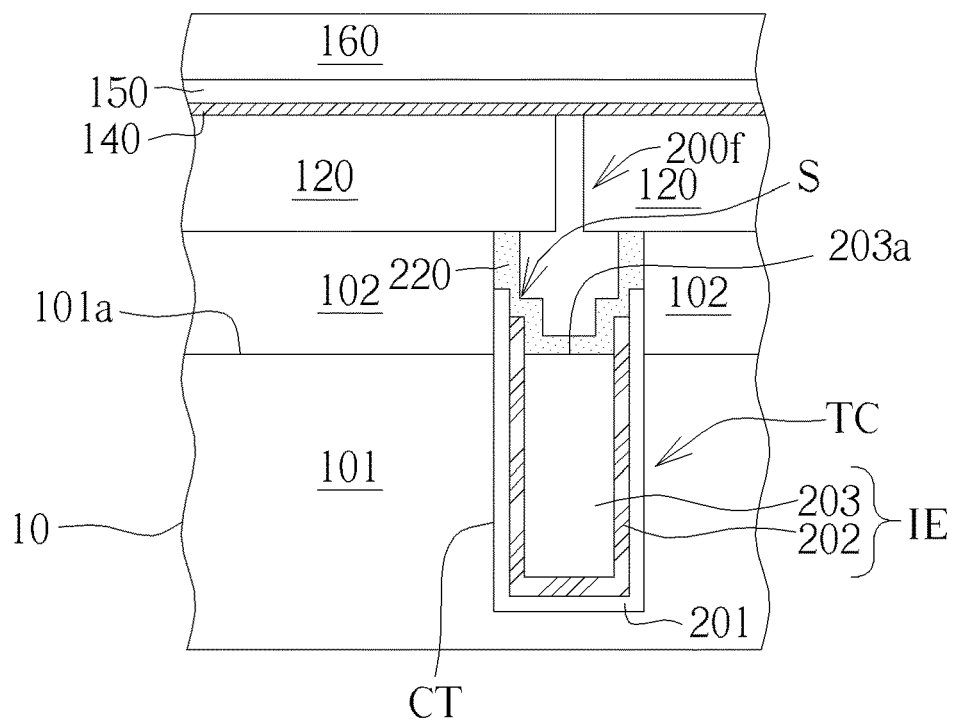

Please refer to FIG. 8A and FIG. 8B. FIG. 8A and FIG. 8B are cross-sectional views taken along line I-I' and II-II' in FIG. 3, respectively. As shown in FIG. 8A and FIG. 8B, after recessing the FCVD oxide layer 150, a high-density plasma CVD (HDPCVD) process is performed to deposit a HDP oxide layer 160 on the substrate 10. The HDP oxide layer 160 is then subjected to a CMP process to form a planarized top surface.

Figure 9A:
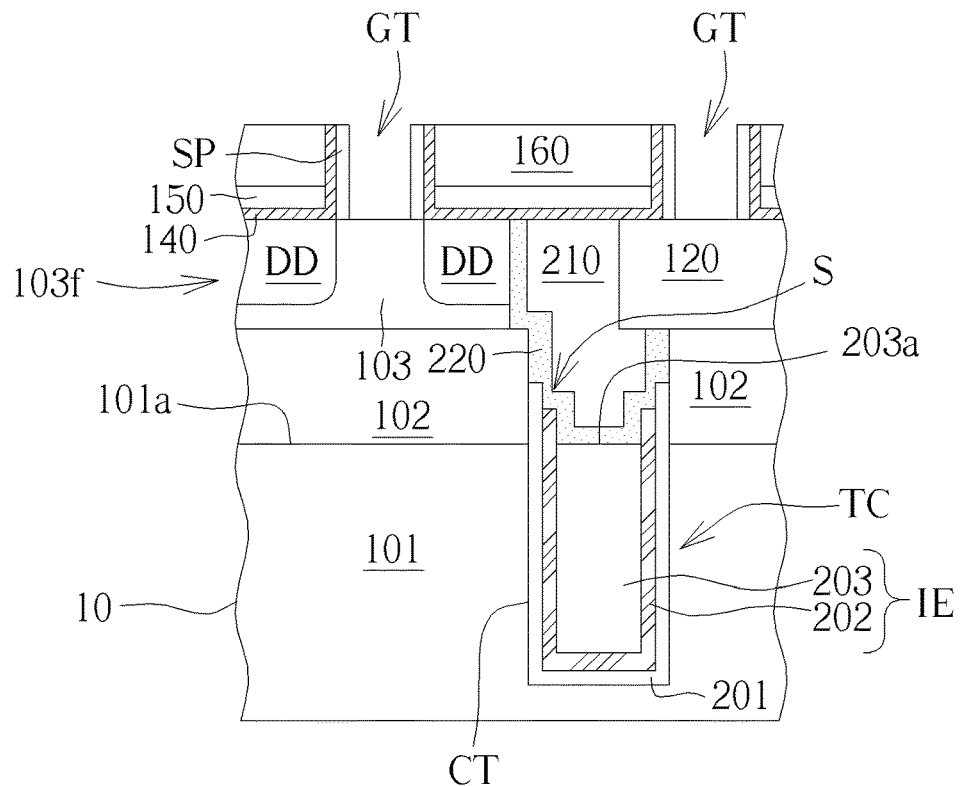
FIG. 9A and FIG. 9B are cross-sectional views taken along line I-I' and II-II' in FIG. 3, respectively, which represent the semiconductor structure after the DPR process is completed.
Figure 9B:
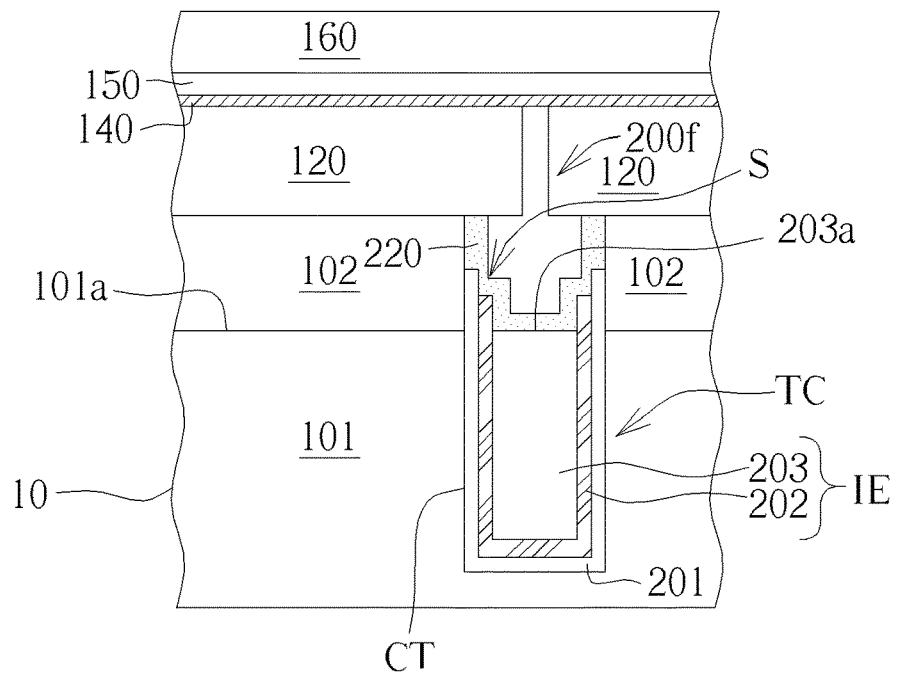

Please refer to FIG. 9A and FIG. 9B. FIG. 9A and FIG. 9B are cross-sectional views taken along line I-I' and II-II' in FIG. 3, respectively, which represent the semiconductor structure after dummy poly removal (DPR) process is completed. As shown in FIG. 9A and FIG. 9B, subsequently, an etching process may be performed to remove the dummy gates DG, thereby forming gate trenches GT.

Figure 10A:
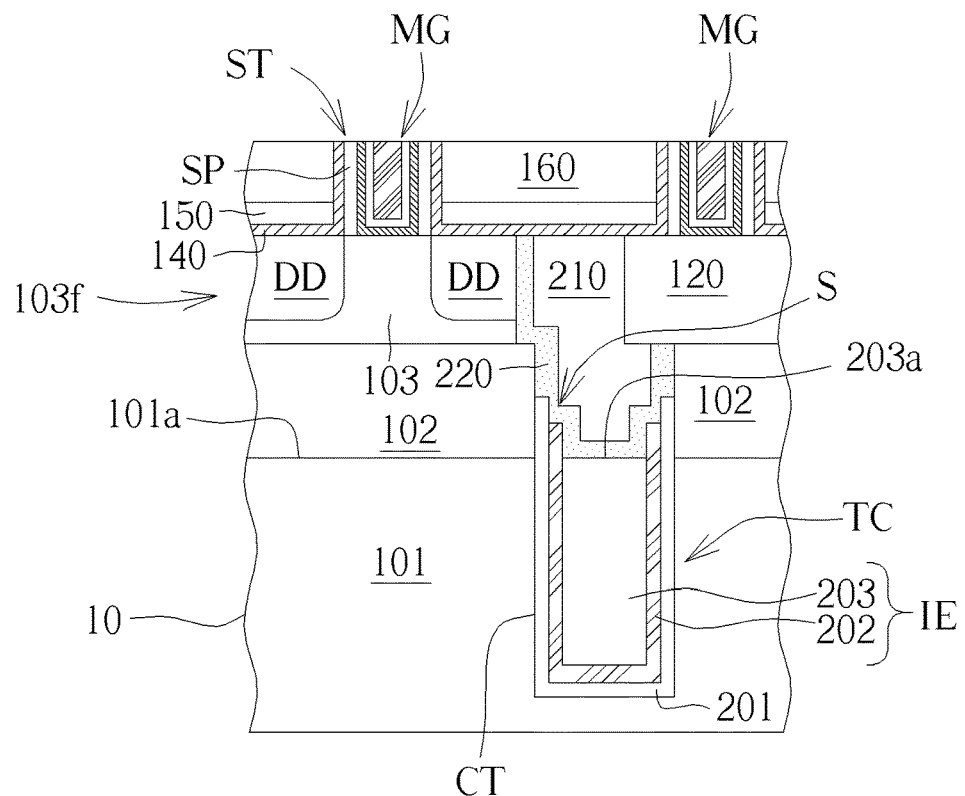
FIG. 10A and FIG. 10B are cross-sectional views taken along line I-I' and II-II' in FIG. 3, respectively, which represent the semiconductor structure after the RMG process is completed.
Figure 10B:
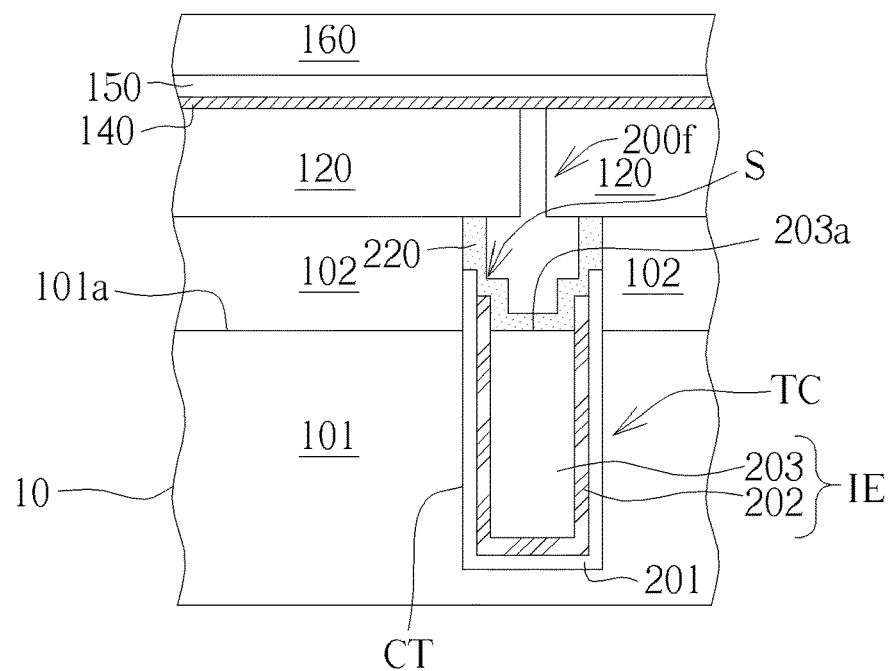

Please refer to FIG. 10A and FIG. 10B. FIG. 10A and FIG. 10B are cross-sectional views taken along line I-I' and II-II' in FIG. 3, respectively, which represent the semiconductor structure after replacement metal gate (RMG) process is completed. As shown in FIG. 10A and FIG. 10B, subsequently, metal gates MG are formed in the gate trenches GT. Since the RMG process is known in the art, the details are omitted. For example, the RMG process may comprise deposition of high-k dielectric layer, barrier layers such as TiN, work-function metal layers, and/or low-resistance metal such as tungsten, but not limited thereto.

A select transistor ST is formed in the silicon fin 103f. The select transistor ST comprises the metal gate MG on the silicon fin 103f and doped regions DD that functions as source or drain in the silicon fin 103f. For example, the doped regions DD may be formed by using an ion implantation process and an annealing process. Through the embedded contact 200, the inner capacitor electrode IE is electrically coupled to the doped region DD of the select transistor ST. The silicide layer 220 form low resistance ohmic contact between the doped region DD and the metallic layer 210.

Figure 11A:
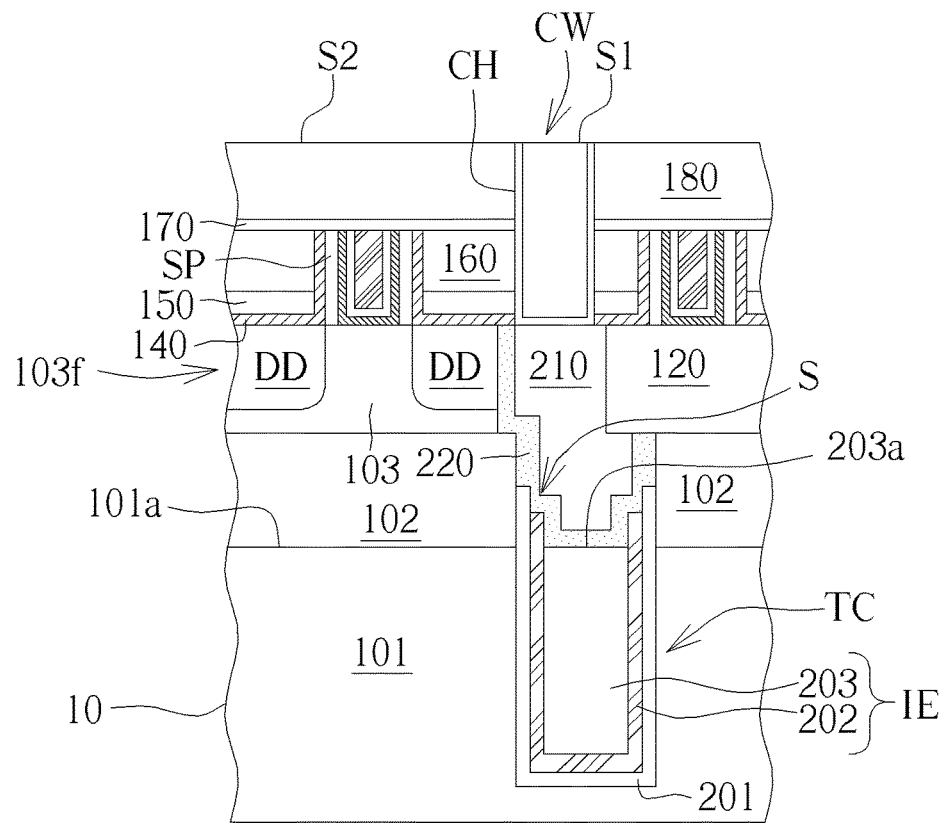
FIG. 11A and FIG. 11B are cross-sectional views taken along line I-I' and II-II' in FIG. 3, respectively, which represent the semiconductor structure after the contact plug is formed.
Figure 11B:
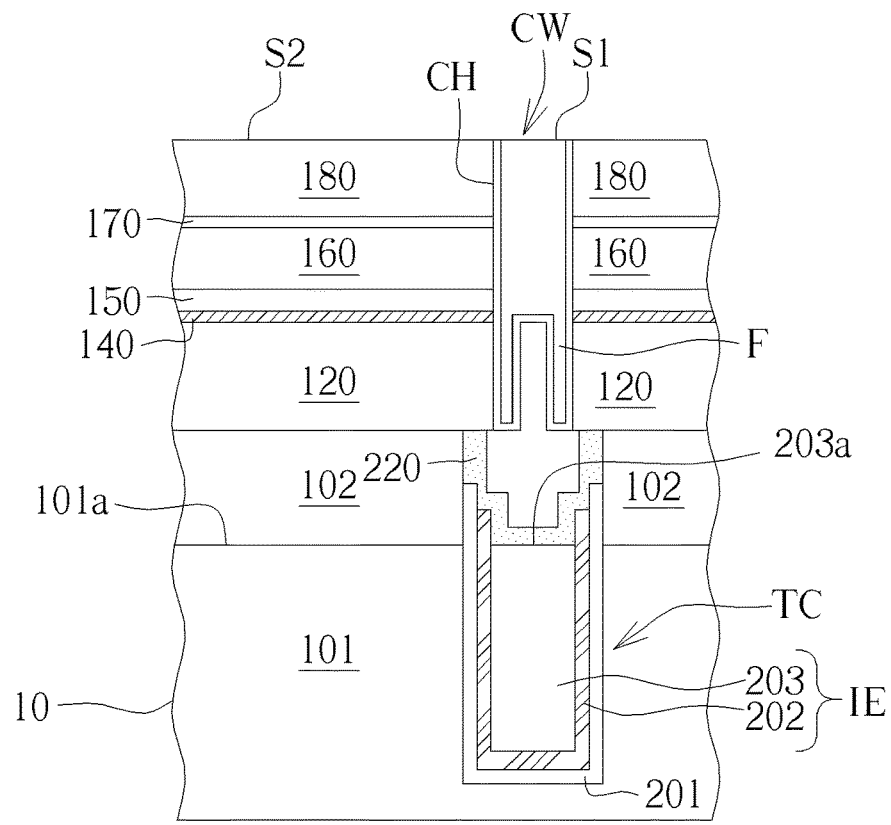

Please refer to FIG. 11A and FIG. 11B. FIG. 11A and FIG. 11B are cross-sectional views taken along line I-I' and II-II' in FIG. 3, respectively, which represent the semiconductor structure after the contact plug is formed. As shown in FIG. 11A and FIG. 11B, a capping layer 170 such as a silicon nitride layer is then deposited on the substrate 10 in a blanker manner. Subsequently, a dielectric layer 180 is deposited on the capping layer 170. A lithographic process and a dry etching process are performed to etch the dielectric layer 180, the capping layer 170, the HDP oxide layer 160, the FCVD oxide layer 150, the POC layer 140, and the silicon oxide film 120 around the fin-shaped contact portion 200f, thereby forming a contact hole CH. Subsequently, the contact hole CH is filled with a conductive layer such as a tungsten layer, and the conductive layer is subjected to a CMP process, thereby forming a contact plug CW in the contact hole CH. As shown in FIG. 11B, the fin-shaped contact portion 200f is sandwiched by the fork-shaped lower portion F of the contact plug CW. According to one embodiment, the top surface S1 of the contact plug CW is coplanar with the top surface S2 of the surrounding dielectric layer 180.

Figure 12A:
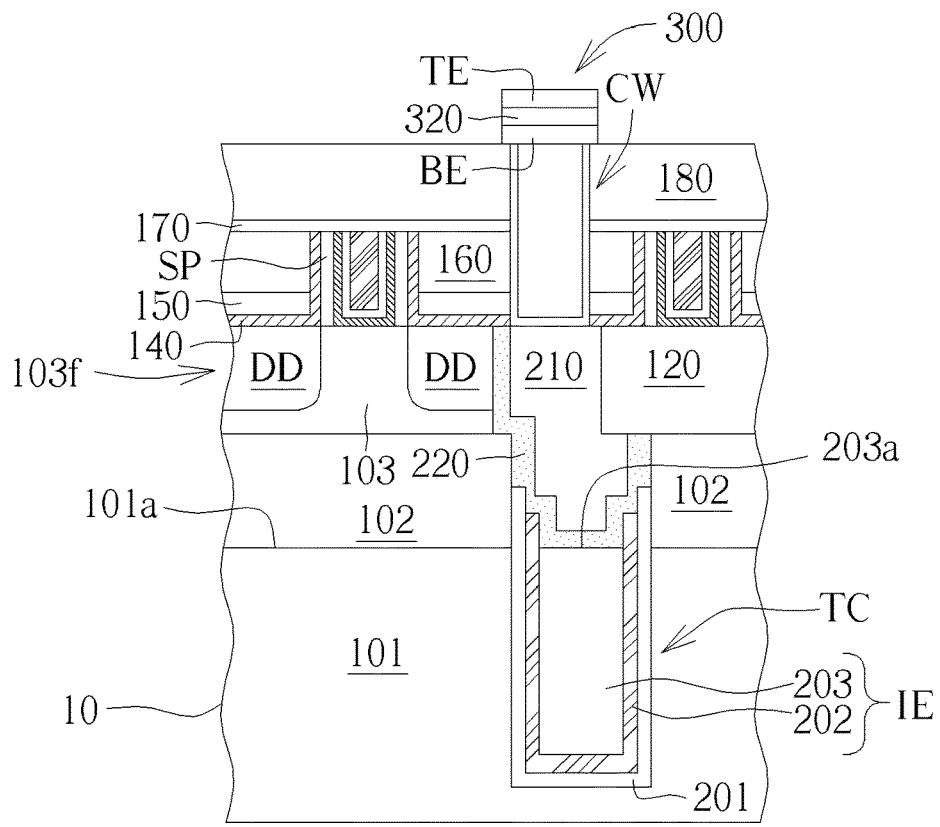
FIG. 12A and FIG. 12B are cross-sectional views taken along line I-I' and II-II' in FIG. 3, respectively, which represent the semiconductor structure after the MTJ element is formed on the contact plug.
Figure 12B:
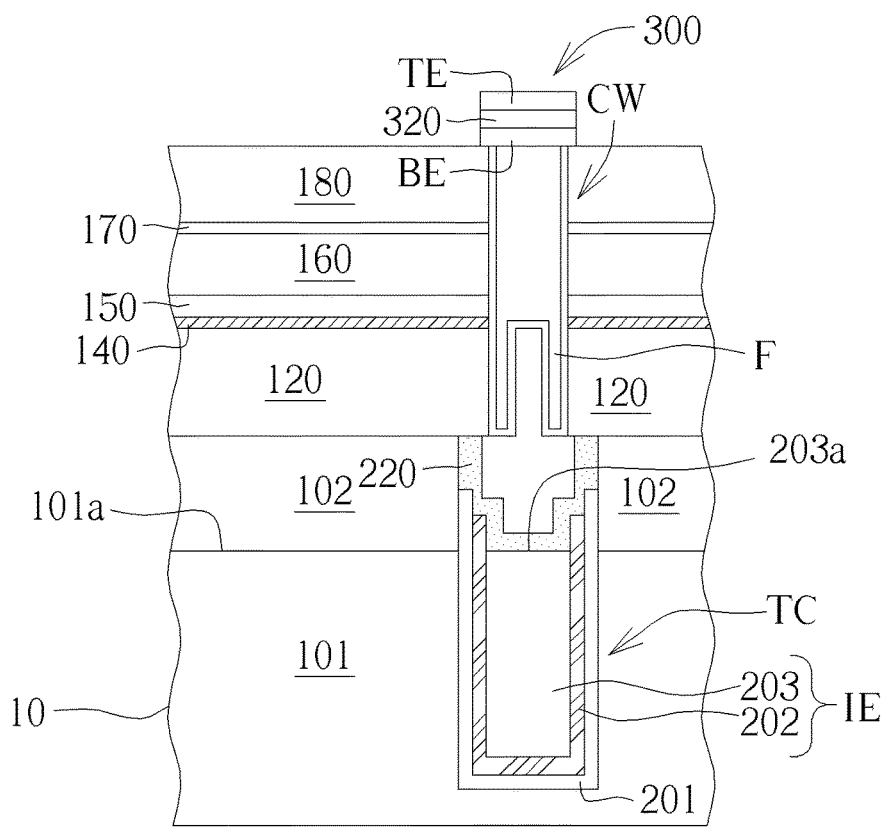

Please refer to FIG. 12A and FIG. 12B. FIG. 12A and FIG. 12B are cross-sectional views taken along line I-I' and II-II' in FIG. 3, respectively, which represent the semiconductor structure after the MTJ element is formed on the contact plug. As shown in FIG. 12A and FIG. 12B, a memory stack 300 may be formed on the contact plug CW. In some embodiments, the memory stack 300 may be formed in a circuit layer, wherein the memory stack 300 is electrically connected to the contact plug CW through the circuit layer. The memory stack 300 may comprise a MTJ element 320 sandwiched by a bottom electrode BE and a top electrode TE. The bottom electrode BE of the MTJ element 320 is electrically coupled to the doped region DD and the capacitor inner electrode IE through the contact plug CW. For example, the bottom electrode BE may comprise NiCr, Ru, Cu, Ta, TaN, Ti, TiN, or any combination thereof.

According to one embodiment, the MTJ element 320 may comprise layered structure including, but not limited to, a reference layer (or pinned layer), a tunnel barrier layer stacked directly on the reference layer, and a free layer stacked directly on the tunnel barrier layer.

According to one embodiment, the reference layer may comprise a magnetic material comprising Co and Fe.

According to one embodiment, the reference layer may comprise CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. According to one embodiment, the reference layer may comprise a magnetic superlattice structure comprising repeated alternating layers of two or more materials, including $(Co/Pt)_n$, $(Co/Pd)_n$, $(Co/Ni)_n$, $(CoFe/Pt)_n$, $(Co/Pt(Pd))_n$, or any combination thereof, wherein n is an integral.

According to one embodiment, for example, the tunnel barrier layer may comprise an insulator comprising MgO, $AlO_x$, MgAlO, MgZnO, HfO, or any combination thereof. According to one embodiment, for example, the free layer comprises Fe, Co, B, Ni, or any combination thereof.

According to one embodiment, the MTJ element 320 may further comprise a capping layer, such as MgO, interposed between the top electrode TE and the free layer. According to one embodiment, for example, the top electrode TE may be made of ruthenium (Ru) having a hexagonal close packed (hcp) crystalline structure. The top electrode TE also acts as an etching stopper, for example, during an ion beam etching process. The MTJ element 320 is electrically connected to an overlying bit line through the top electrode TE.

Figures 13A, 13B:
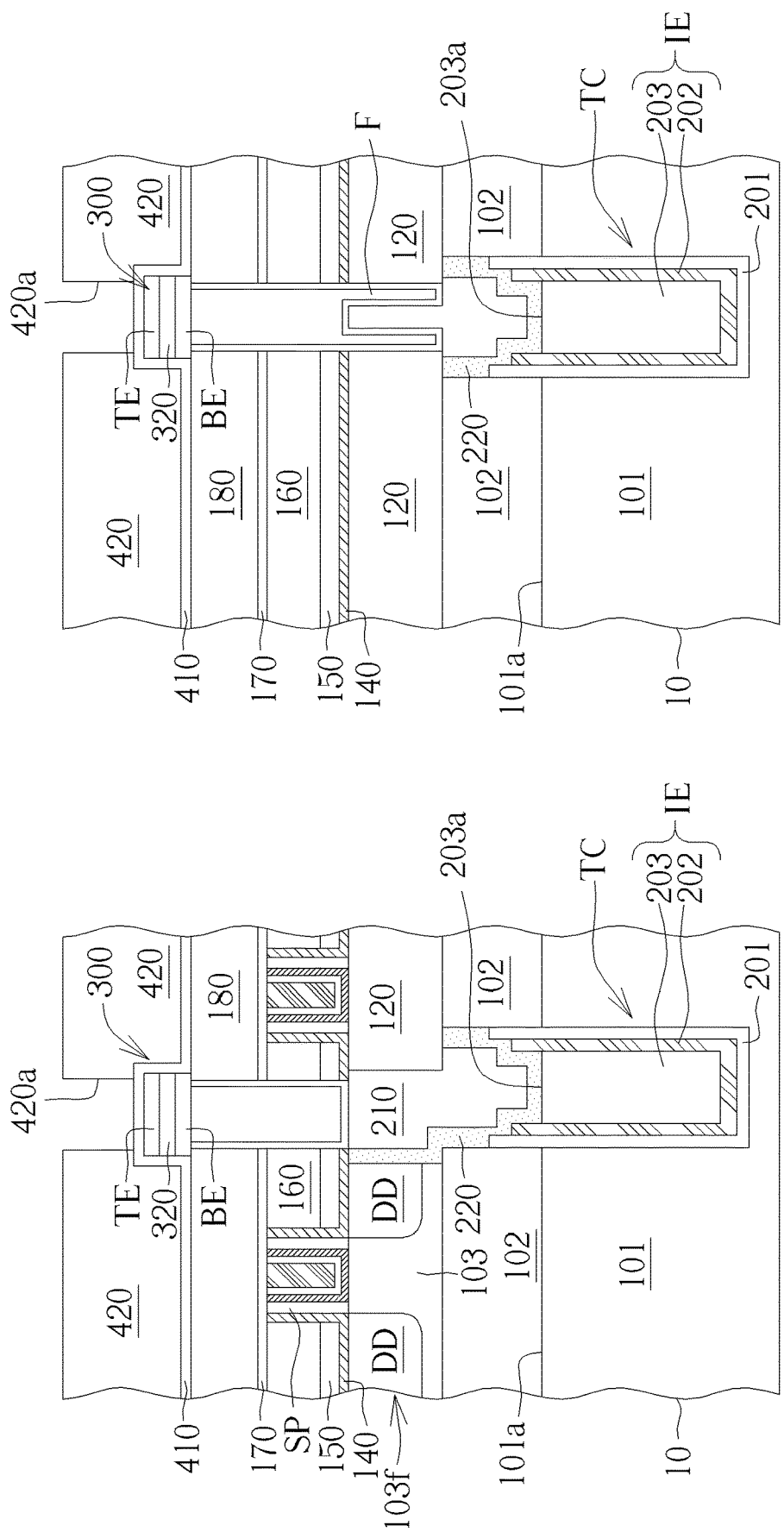
FIG. 13A and FIG. 13B are cross-sectional views taken along line I-I' and II-II' in FIG. 3, respectively, which represent the semiconductor structure after the MTJ cap is formed on the memory stack.

Please refer to FIG. 13A and FIG. 13B. FIG. 13A and FIG. 13B are cross-sectional views taken along line I-I' and II-II' in FIG. 3, respectively, which represent the semiconductor structure after the MTJ cap is formed on the memory stack 300. As shown in FIG. 13A and FIG. 13B, a capping layer 410 such as a silicon nitride layer is formed on the memory stack 300. Subsequently, a dielectric layer 420 is deposited on the capping layer 410. A lithographic process and an dry etching process are carried out to form a via hole 420a in the dielectric layer 420 and directly above the memory stack 300. A portion of the top electrode TE may be exposed in the via hole 420a.

Figures 14A, 14B:
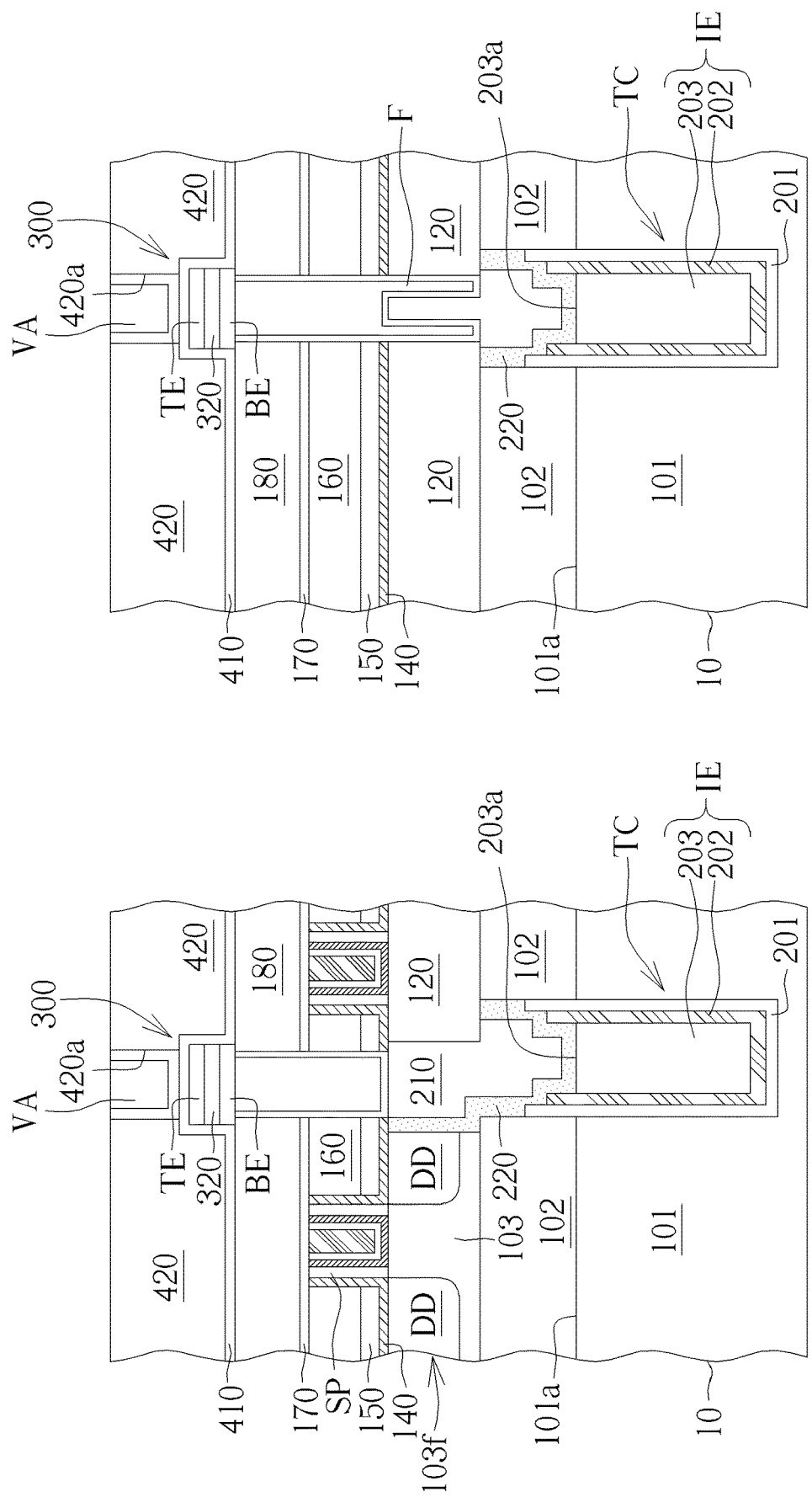
FIG. 14A and FIG. 14B are cross-sectional views taken along line I-I' and II-II' in FIG. 3, respectively, which represent the semiconductor structure after the via is formed on the memory stack.

Please refer to FIG. 14A and FIG. 14B. FIG. 14A and FIG. 14B are cross-sectional views taken along line I-I' and II-II' in FIG. 3, respectively, which represent the semiconductor structure after the via is formed on the memory stack 300. As shown in FIG. 14A and FIG. 14B, a via plug VA is formed in the via hole 420a and is electrically connected to the top electrode TE. For example, a tungsten layer is deposited into the via hole 420a. The tungsten layer is then subjected to a CMP process to form a planarized top surface.

It is advantageous to use the present disclosure because the storage capacitance and data retention time of the D-MRAM device can be significantly increased by incorporating a capacitor. Since the capacitor can provide greater capacitance, the retention time of the D-MRAM devices is significantly increased. The proposed semiconductor structure is able to dramatically reduce the frequency of data refreshing and thus the leakage power of the D-MRAM devices. Further, since the embedded contact comprises a fin-shaped contact portion that is clamped by the lower portion of the tungsten contact plug, the capacitor charge and discharge time of the D-MRAM device can be greatly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
a substrate comprising a doped silicon substrate, a buried oxide layer on the doped silicon substrate, and a silicon device layer on the buried oxide layer;
a capacitor comprising an inner electrode and a node dielectric layer in a trench of the substrate, wherein the inner electrode and the node dielectric layer penetrate through the buried oxide layer and extend into the doped silicon substrate;
a select transistor in the silicon device layer and in proximity to the capacitor, wherein the silicon device layer forms a silicon fin;
an embedded contact atop the capacitor to electrically couple a doped region of the select transistor with the inner electrode of the capacitor, wherein the embedded contact comprises a metallic layer wrapped around by a silicide layer, and wherein a portion of the silicide layer is interposed between the metallic layer and the inner electrode, wherein the inner electrode comprises a doped polysilicon layer and a TiN layer between the node dielectric layer and the doped polysilicon layer, wherein the TiN layer protrudes from a top surface of the doped polysilicon layer, and wherein an upper end of the node dielectric layer, an upper end of the TiN layer, and the top surface of the doped polysilicon layer form a step structure around an upper portion of the trench, and wherein the silicide layer completely covers the step structure;
a first dielectric layer around the select transistor;
a second dielectric layer covering the first dielectric layer and the select transistor;
a contact plug penetrating through the second dielectric layer and the first dielectric layer and being in direct contact with the embedded contact; and
a memory stack electrically connected to the contact plug, wherein the memory stack comprises a magnetic tunnel junction (MTJ) element.

2. The semiconductor structure according to claim 1, wherein the node dielectric layer lines a sidewall of the trench.

3. The semiconductor structure according to claim 2, wherein the inner electrode is surrounded by the node dielectric layer.

4. The semiconductor structure according to claim 1, wherein the doped polysilicon layer has a top surface that is higher than an upper surface of the doped silicon substrate.

5. The semiconductor structure according to claim 1, wherein the embedded contact is buried in the silicon device layer, the first dielectric layer and the buried oxide layer.

6. The semiconductor structure according to claim 1, wherein the embedded contact comprises a fin-shaped contact portion sandwiched by a fork-shaped lower portion of the contact plug.

7. The semiconductor structure according to claim 6, wherein a metal gate is disposed on the silicon fin.

8. The semiconductor structure according to claim 1, wherein the silicide layer is interposed between the silicon fin and the fin-shaped contact portion.

9. The semiconductor device according to claim 1, wherein the metallic layer comprises W, Ti, TiN, Ta, TaN, Cu, Au, Ni, or any combinations thereof.

10. The semiconductor device according to claim 1, wherein the silicide layer comprises tungsten silicide, cobalt silicide, nickel silicide, or titanium silicide.

11. The semiconductor structure according to claim 1, wherein the contact plug is a tungsten contact plug.

12. The semiconductor structure according to claim 1, wherein the memory stack is formed in a circuit layer, wherein the memory stack is electrically connected to the contact plug through the circuit layer.

13. The semiconductor structure according to claim 1, wherein the memory stack is disposed on the contact plug.

14. The semiconductor structure according to claim 1, wherein the MTJ element comprises a reference layer, a tunnel barrier layer on the reference layer, and a free layer on the tunnel barrier layer.

15. The semiconductor structure according to claim 14, wherein the reference layer comprises a magnetic material comprising Co and Fe.

16. The semiconductor structure according to claim 14, wherein the reference layer comprises a magnetic superlattice structure comprising repeated alternating layers of two or more materials, including $(Co/Pt)_n$, $(Co/Pd)_n$, $(Co/Ni)_n$, $(CoFe/Pt)_n$, $(Co/Pt(Pd))_n$, or any combination thereof.

* * * * *